United States Patent
Tanaka et al.

(10) Patent No.: US 8,199,260 B2
(45) Date of Patent: Jun. 12, 2012

(54) PICTURE SIGNAL DETECTING APPARATUS

(75) Inventors: Tsutomu Tanaka, Ora-gun (JP);
Mutsuki Niki, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 1258 days.

(21) Appl. No.: 11/812,628

(22) Filed: Jun. 20, 2007

(65) Prior Publication Data

US 2008/0002066 A1 Jan. 3, 2008

(30) Foreign Application Priority Data

Jun. 29, 2006 (JP) .................................. 2006-178914

(51) Int. Cl.
*H04N 5/455* (2006.01)

(52) U.S. Cl. ................. 348/726; 348/433.1; 348/475; 348/E3.022; 340/12.21

(58) Field of Classification Search .................. 348/726
See application file for complete search history.

(56) References Cited

U.S. PATENT DOCUMENTS

| | | | | |
|---|---|---|---|---|
| 5,258,842 A | * | 11/1993 | Nishikawa | 348/691 |
| 5,298,999 A | * | 3/1994 | Nagano | 348/497 |
| 6,041,029 A | * | 3/2000 | Iida et al. | 369/47.18 |
| 6,734,739 B2 | * | 5/2004 | Kawahara | 331/25 |

FOREIGN PATENT DOCUMENTS

| | | |
|---|---|---|
| JP | A-55-052684 | 4/1980 |
| JP | A-04-323923 | 11/1992 |
| JP | A-2001-333439 | 11/2001 |

OTHER PUBLICATIONS

Office Action issued Nov. 30, 2011 in counterpart Indian Patent Application No. 1362/DEL/2007.

* cited by examiner

*Primary Examiner* — Jefferey Harold
*Assistant Examiner* — Omer Khalid
(74) *Attorney, Agent, or Firm* — Oliff & Berridge, PLC

(57) ABSTRACT

In a VIF circuit for synchronously detecting a picture signal from an AM-modulated PIF signal, the accuracy of a picture signal to be demodulated is maintained even in a state of overmodulation. A comparator (68) determines whether the picture signal exceeds $V_{TH}$, which is a state of overmodulation. In a period in which the signal is less than or equal to $V_{TH}$, a switch circuit (56) inputs an output voltage of an APC filter (54) to a VCO (48), and a PLL is formed. The PLL operates so as to lock onto the PIF signal, and reproduces a carrier wave. On the other hand, in a period in which the signal exceeds $V_{TH}$, the switch circuit (56) inputs an output voltage $V_{SH}$ of an SH circuit (58) to the VCO (48). The SH circuit (58) holds the voltage of the APC filter (54) that is in a locked state in a horizontal synchronizing period and uses the voltage to control the VCO (48), whereby free run and frequency drifting are minimized.

5 Claims, 5 Drawing Sheets

PICTURE SIGNAL DETECTING APPARATUS

CROSS-REFERENCE TO RELATED APPLICATION

The priority application number JP2006-178914 upon which this patent application is based is hereby incorporated by the reference.

BACKGROUND OF THE INVENTION

1. Field of the Invention

The present invention relates to a picture signal detecting apparatus for detecting a picture signal from a picture modulated signal wherein a carrier wave has been amplitude-modulated. In particular, the present invention relates to a circuit that suitably operates in a state of overmodulation exceeding 100%.

2. Description of the Related Art

A television receiver down-converts a target radio-frequency television signal received from a broadcast station to a predetermined intermediate frequency (IF), and demodulates a picture signal, color signal, and sound signal from the IF signal. For example, a VIF (video intermediate frequency) circuit demodulates a picture signal including brightness information from an intermediate-frequency picture modulated signal ("picture IF signal" shall be referred to below as "PIF signal"). The PIF signal is amplitude-modulated according to the picture signal, the VIF circuit reproduces a carrier wave of the PIF signal, the reproduced carrier wave is used to perform synchronous detection, and the picture signal is extracted.

FIG. 1 is a block diagram showing a structure of a conventional VIF circuit. A PIF signal input from an input terminal 2 is amplified in an amplifier 4 and then input to a wave detector (VDET) 6 and an APC (automatic phase control) wave detector 8. The APC wave detector 8, a voltage controlled oscillator (VCO) 10, and a phase converter 12 form a phase locked loop (PLL) and reproduce a carrier wave on the basis of the inputted PIF signal.

The phase converter 12 generates two signals having a phase difference of ±45° in relation to the input signal from the VCO 10. One of the signals is output to the APC wave detector 8. The other signal is output to the VDET 6. For example, output having a +45° phase difference is input from the phase converter 12 to the APC wave detector 8. The PLL performs a synchronous control so that a phase difference of 90° will be present between the two input signals input to the APC wave detector 8.

The APC wave detector 8 combines the two input signals, and outputs a current $I_{APC}$ as a DC component that corresponds to the difference between the frequencies of the input signals. The $I_{APC}$ corresponds to a degree δ of phase shifting between a target value of 90° and the phase difference between the two signals. A high-frequency component that corresponds to a sum of the frequencies is also output from the APC wave detector 8. An APC filter 14 that is a low pass filter (LPF) is connected to the output side of the APC wave detector 8. The APC filter 14 performs a smoothing operation, and removes the high-frequency component. The APC filter integrates the $I_{APC}$ at a predetermined time constant, and converts the $I_{APC}$ to a control voltage for the VCO 10.

For example, when the PLL is configured so that a signal input from the phase converter 12 to the APC wave detector 8 has a phase difference of +90° in relation to the PIF signal input from the amplifier 4 to the APC wave detector 8, a reproduced carrier wave that has the same frequency as the carrier wave of the PIF signal and a phase difference of 0° in relation to the carrier wave of the PIF signal will be obtained as the signal input from the phase converter 12 to the VDET 6. In other words, the phase difference between the PIF signal input to the VDET 6 and the reproduced carrier wave is controlled to be 0°.

The VDET 6 AM-detects the PIF signal from the amplifier 4 by synchronous detection using the reproduced carrier wave from the phase converter 12, and extracts the picture signal. The extracted picture signal is amplified in a video amplifier (VAMP) 16, and output from an output terminal 18.

The picture signal output from the VAMP 16 is input to an automatic gain control (AGC) circuit 20. The AGC circuit 20 controls the gain of the amplifier 4 and adjusts the picture signal to a proper level.

A comparator 22 assesses the overmodulation of the picture signal. The picture signal adjusted to a suitable level is input to one input terminal of the comparator 22. A predetermined standard voltage that corresponds to a threshold value for determining overmodulation is input to the other input terminal. The APC wave detector 8 is configured to control a loop gain of the PLL in accordance with the results of the assessment performed by the comparator 22, as shall be described below.

An upper limit for the overmodulation of the picture is regulated in Japan to be, e.g., a value of 87.5% for ground-based broadcasting. Modulation exceeding this value is referred to as "overmodulation". Therefore, an overmodulated PIF signal may also be produced in various image media and in the broadcasts of other countries. Problems are presented by a state of overmodulation in that the amplitude of the PIF signal is extremely low and that the PLL will not readily be synchronized. In addition, a problem is presented in that a state of overmodulation that exceeds 100% (referred to below as a "state of strong overmodulation") the picture signal will be folded back to a region that is less than 100%. Therefore, accurate tones will not be reproduced on a screen.

FIG. 2 is a schematic diagram of an example of the PIF signal and picture signal showing this folding back. An original picture signal 30 is an envelope curve that traces mutually same-phase peaks of the PIF signal 32. A PIF signal 32 has a polarity that is mutually inverted in a period 34 where the degree of picture modulation exceeds 100% and in periods 36 of less than 100%. When the PIF signal 32 is input to the APC wave detector 8, the PLL reflects the 180° phase shift caused by this inversion. As a result, the phase of the reproduced carrier wave input to the VDET 6 is also shifted 180°, and the envelope curve on the lower side indicated by the dotted line is detected as the picture signal 38 in the period 34. Thus, the picture signal having a degree of picture modulation that exceeds 100% is returned downward with the 100% line as a center. Therefore, in this portion, as the degree of picture modulation increases, the picture becomes increasingly unnatural and dark.

In order to avoid this folding back, the conventional circuit is configured so that the APC wave detector 8 will switch the output current $I_{APC}$ during overmodulation to an extremely low value or to zero on the basis of the results of the assessment performed by the comparator 22. Accordingly, loop gain in the PLL is minimized, the PLL is prevented from also being shifted in phase by 180° when the polarity of the PIF signal 32 inverts, and instances of returning are prevented. In other words, the conventional VIF circuit reduces instances of loop gain during a state of overmodulation, whereby the relationship between the phases of the PIF signal and the reproduced carrier wave is maintained while the PLL is locked before the state of overmodulation occurs. However, when loop gain is minimized, the oscillation of the VCO 10 may be in a state of free run, and it may become impossible to stop drifting in the oscillation frequency of the VCO 10 due to, e.g., changes in the control voltage of the VCO 10 that result from, e.g., electrical discharge in the APC filter 14. For this reason, the relationship between the phases of the PIF signal and the reproduced carrier wave cannot necessarily be suitably maintained in a state of overmodulation. As a result, a problem is presented in that the phase of the reproduced carrier wave provided to the VDET 6 will fluctuate, the precision of the picture signal demodulated in the VDET 6 will decrease, and the picture quality will accordingly deteriorate.

SUMMARY OF THE INVENTION

The present invention was devised in order to resolve the abovementioned problems. The present invention provides a picture signal detecting apparatus capable of demodulating a suitable picture signal even in a state of overmodulation.

A picture signal detecting apparatus according to the present invention has a phase locked loop for generating a carrier wave reproduced on the basis of a picture modulated signal in which an original carrier wave has been amplitude-modulated in accordance with a picture signal; a detecting circuit for synchronously detecting the picture signal from the picture modulated signal using the reproduced carrier wave; a sample-and-hold circuit for sampling and holding a control voltage of a voltage controlled oscillator in the phase locked loop in a locked state of the phase locked loop wherein the picture modulated signal is in state of normal modulation that is less than or equal to a predetermined degree of modulation threshold value, and outputting the control voltage as a hold voltage; an overmodulation detecting circuit for detecting a state of overmodulation in which the degree of modulation threshold value has been exceeded; and a control voltage switching circuit for inputting the hold voltage to the voltage controlled oscillator instead of the control voltage in the state of overmodulation.

DESCRIPTION OF THE PREFERRED EMBODIMENTS

Embodiments of the present invention shall be described below with reference to the drawings.

Figure 1:
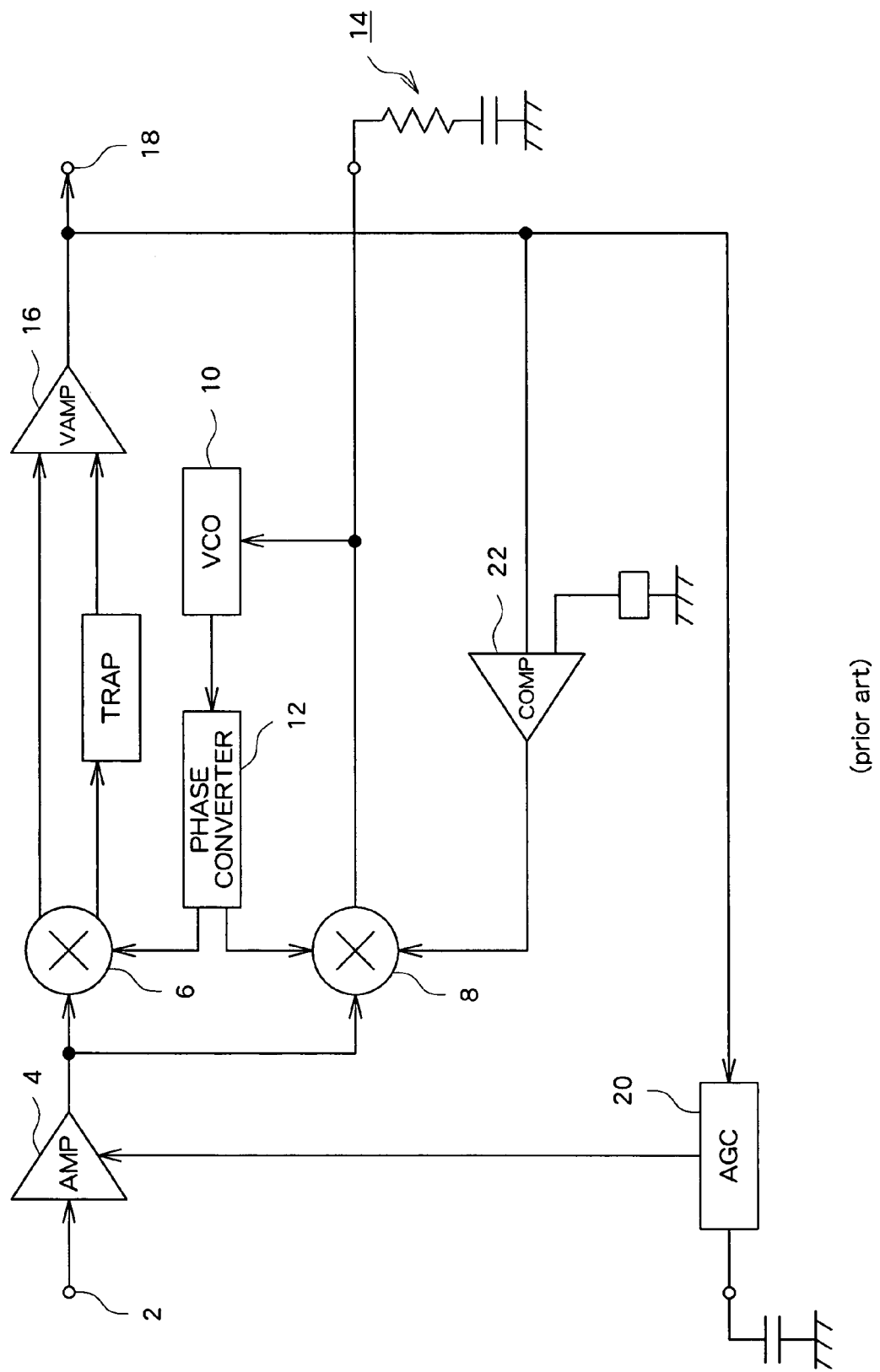
FIG. 1 is a block diagram showing a structure of a conventional VIF circuit.
Figure 2:
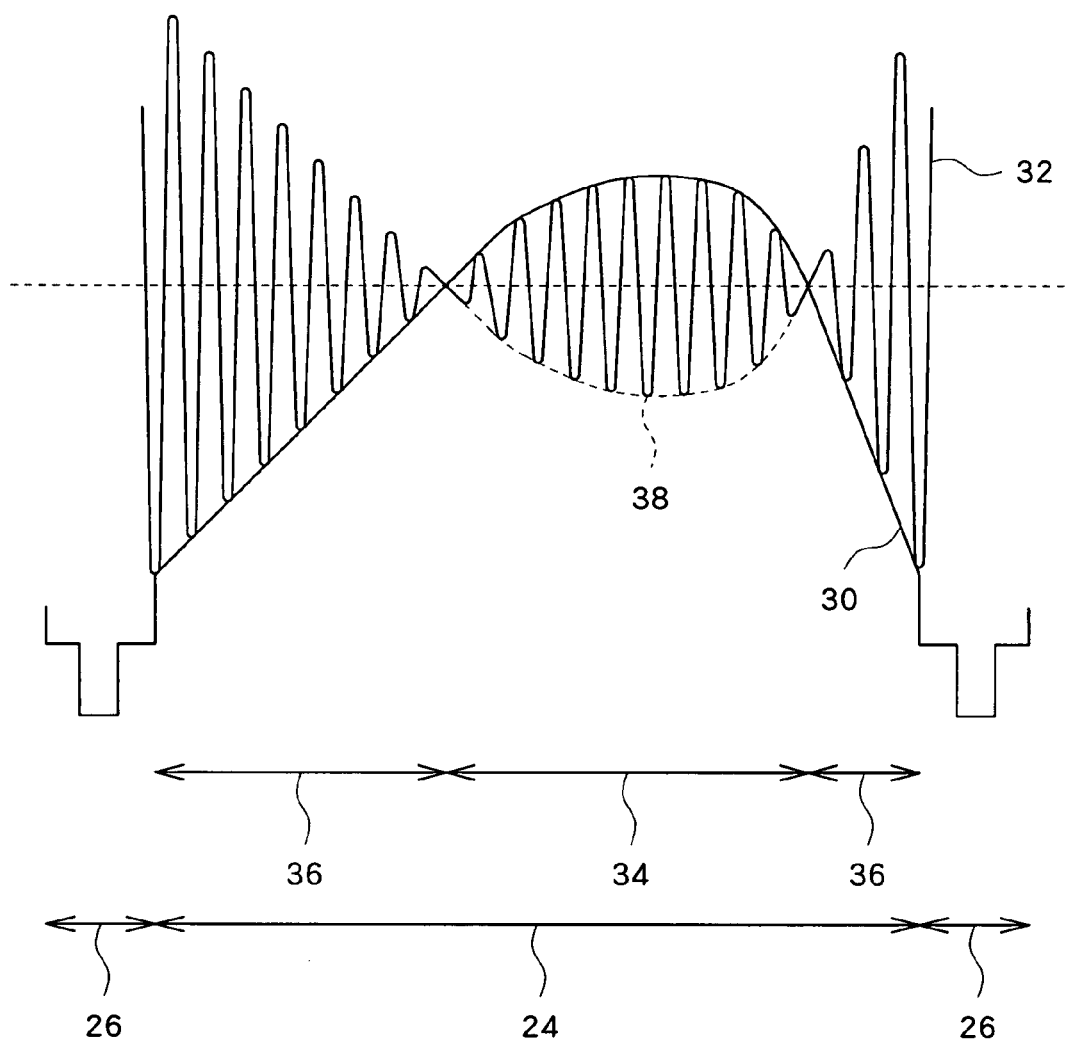
FIG. 2 is a schematic view of examples of a PIF signal and picture signal showing folding back in the picture signal, which is a problem of the prior art.
Figure 3:
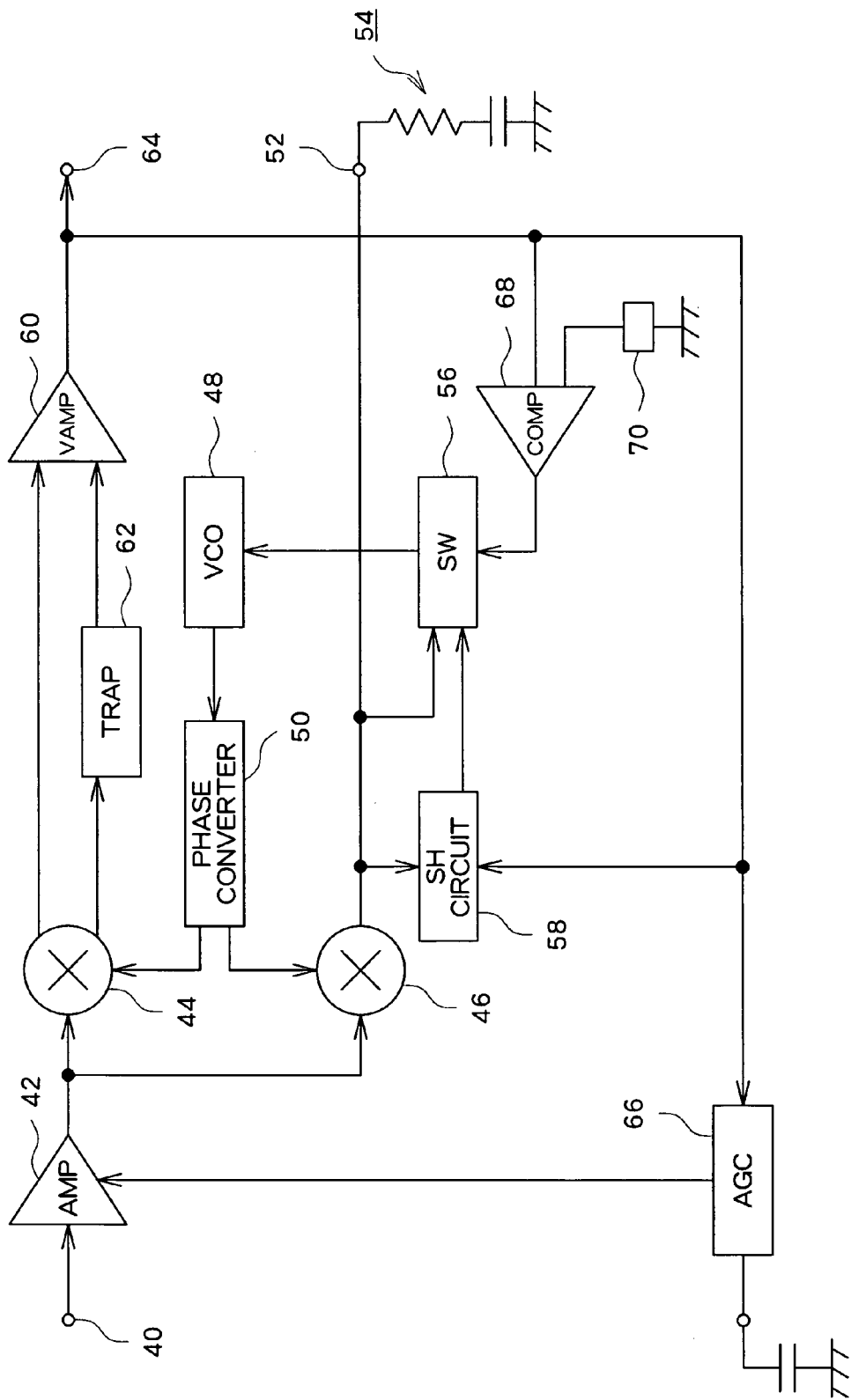
FIG. 3 is a block diagram showing a schematic configuration of a VIF circuit of an embodiment of the present invention.

FIG. 3 is a block diagram showing a schematic configuration of a VIF circuit according to an embodiment. The present circuit can be formed as part of, e.g., a semiconductor integrated circuit (IC) for processing a received television signal.

The PIF signal input from an input terminal 40 is amplified in an amplifier 42 and then input to a VDET 44 and an APC wave detector 46. The VDET 44 and APC wave detector 46 each include a mixer for multiplying the two inputted signals.

The APC wave detector 46, a VCO 48, and a phase converter 50 form a PLL, and reproduce a carrier wave on the basis of the PIF signal input to the APC wave detector 46.

The phase converter 50 generates two signals having a phase difference of ±45° in relation to the input signal from the VCO 48. One of the signals is output to the APC wave detector 46. The other signal is output to the VDET 44. For example, an output signal having a phase difference of +45° is input from the phase converter 50 to the APC wave detector 46. Therefore, the PLL performs synchronous controls so that a phase difference of 90° is achieved between the two input signals input to the APC wave detector 46.

An output terminal of the APC wave detector 46 is connected to an IC terminal 52. An APC filter 54 can be externally attached to the terminal 52. The APC filter 54 removes a high-frequency component included in the output of the APC wave detector 46. The APC filter 54 also integrates, at a predetermined time constant, and smoothes a current $I_{APC}$ that is a DC component that corresponds to a degree δ of phase shifting in the PIF signal and the reproduced carrier wave, and generates a voltage $V_F(t)$ in the terminal that can change correspondently with time t.

Input terminals of a switch circuit 56 and a sample-and-hold (SH) circuit 58 are connected to a signal wire that connects the APC wave detector 46 and the terminal 52. The switch circuit 56 and SH circuit 58 are connected to the signal wire at a high impedance so as not to have an effect on the functioning of the APC filter 54, and the $V_F(t)$ is introduced.

The SH circuit 58 samples the voltage $V_F(t)$ synchronously with a predetermined timing $t_{SH}$ of the picture signal, holds a value $V_{SH}$ ($\equiv V_F(t_{SH})$) thereof, and sends an output to the switch circuit 56.

When the picture signal is less than or equal to a predetermine voltage $V_{TH}$, the switch circuit 56 outputs, as a control voltage $V_{CNT}$, the $V_F(t)$ that was directly introduced from the signal wire connected to the terminal 52 to the VCO 48. When the picture signal exceeds the $V_{TH}$, the switch circuit 56 outputs $V_{SH}$ input from the SH circuit 58 as $V_{CNT}$.

In other words, when the picture signal is less than or equal to the predetermined voltage $V_{TH}$, a signal path for inputting the output voltage of the APC filter 54 to the VCO 48 is formed passing through the switch circuit 56, and the PLL is realized in the same manner as in the above-described conventional VIF circuit.

For example, when the PLL is configured so that the signal input from the phase converter 50 to the APC wave detector 46 has a phase difference of +90° in relation to the PIF signal input from the amplifier 42 to the APC wave detector 46, a reproduced carrier wave that has the same frequency as the carrier wave of the PIF signal and a phase difference of 0° in relation to the carrier wave of the PIF signal will be obtained as the signal input from the phase converter 50 to the VDET 44. In other words, the phase difference between the PIF signal input to the VDET 44 and the reproduced carrier wave is controlled to be 0°.

The VDET 44 performs synchronous detection using the reproduced carrier wave from the phase converter 50, whereby the PIF signal from the amplifier 42 is AM-detected and a picture signal is extracted. The extracted picture signal is input to a VAMP 60. For example, the VDET 44 can be configured to provide the picture signal and the DC level at the center of the PIF signal to the VAMP 60. A trap circuit 62 for removing a sound carrier-wave component detected while superimposed on the picture signal can be provided to a transmission path of the picture signal. The trap circuit 62 can be configured to switch between on and off in accordance with a control signal. For example, the trap circuit 62 can be turned off when the sound carrier wave component is to be trapped by the external circuit.

The VAMP 60 amplifies the detected picture signal and outputs the picture signal via an output terminal 64. The picture signal output from the VAMP 60 is input to an AGC circuit 66. The AGC circuit 66 controls the gain of the amplifier 42 on the basis of a predetermined signal in a horizontal synchronizing period HBLK within the picture signal so that the picture signal is kept at a proper level.

The switch circuit 56 is switched on the basis of output from a comparator 68. The comparator 68 compares the picture signal output by the VAMP 60 and the voltage $V_{TH}$ provided from a standard-voltage source 70, and outputs the results of the comparison to the switch circuit 56.

Figure 4:
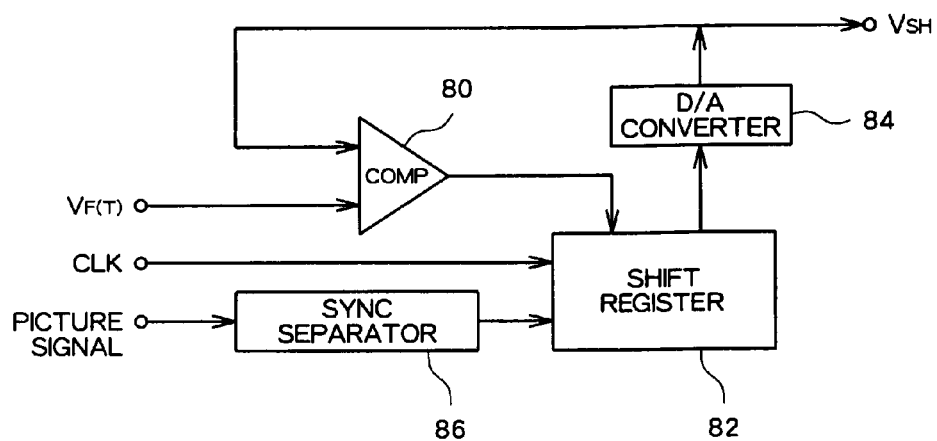
FIG. 4 is a block diagram showing a schematic structure of a sample-and-hold circuit of the embodiment of the present invention.

FIG. 4 is a block diagram showing a schematic configuration of the SH circuit 58. The SH circuit 58 comprises a comparator 80, a shift register 82, a D/A (digital-to-analog) converter 84, and a sync separator 86. The voltage $V_F(t)$ of the APC filter 54 is input to the comparator 80. The D/A converter 84 converts a value stored by the shift register 82 to the voltage $V_{SH}$. The voltage $V_{SH}$ output from the D/A converter 84 is input to the switch circuit 56.

The voltage $V_{SH}$ output from the D/A converter 84 is also input to the comparator 80. The comparator 80 compares the inputted $V_F(t)$ and $V_{SH}$, and outputs, to the shift register 82, an H (high) level that corresponds to a logical value "1" or an L (low) level that corresponds to a logical value "0" in accordance with a magnitude relation between the voltages.

The sync separator 86 receives the picture signal output from the VAMP 60, extracts a specified signal period $P_{SH}$ within a horizontal synchronizing period, and generates a sampling gate pulse that corresponds to the signal period $P_{SH}$. The shift register 82 makes it possible to update memory content of only the specified signal period $P_{SH}$ in which the sampling gate pulse is inputted to be updated.

The shift register 82 operates synchronously with a clock signal CLK and updates memory content in the period $P_{SH}$ on the basis of the output level of the comparator 80. For example, the CLK can be a clock which is generated by a quartz oscillator housed in a television receiver circuit that uses the present circuit and provided to parts of the receiver circuit. The frequency of the CLK in an NTSC television receiver circuit is set to, e.g., 3.5795 MHz.

The comparator 80 and shift register 82 perform an operation for successively approximating the introduced voltage $V_F(t)$, and sequentially establish values from a first bit that is a most significant bit (MSB) of the shift register 82 having n bits to an nth bit that is a least significant bit (LSB). In relation to the shift register 82, a time series in the period $P_{SH}$ set synchronously with the CLK is expressed as $t_k$ ($0 \leq k \leq n$), a memory value of the shift register 82 at times $t_k$ is expressed as $B_k$, and a value for the output voltage of the D/A converter 84 that corresponds to $B_k$ is expressed as $V_k$. For example, the comparator 80 compares $V_{k-1}$ and $V_F(t_{k-1})$ at each time $t_k$, and the shift register 82 sets as $B_k$ a value ($B_{k-1}+2^{n-k}$) obtained by adding $2^{n-k}$, which corresponds to the kth bit, to $B_{k-1}$ when the results of the comparison indicate that $V_F(t_{k-1}) > V_{k-1}$. The shift register sets as $B_k$ a value ($B_{k-1}-2^{n-k}$) obtained by subtracting $2^{n-k}$ from $B_{k-1}$ when the results of the comparison indicate that $V_F(t_{k-1}) \leq V_{k-1}$. When $B_{k-1}+2^{n-k}$ exceeds an upper limit value $2^n-1$ of the shift register 82 or when $B_{k-1}-2^{n-k}$ is less than zero, $B_{k-1}$ is set as $B_k$.

The memory value in the period $P_{SH}$ and the voltage $V_{SH}$ output to the switch circuit 56 are updated in the SH circuit 58 by the above-described operation. Thus, an update is performed in the horizontal synchronizing period, whereby a fixed $V_{SH}$ is obtained in a picture period in which the picture signal contains active picture information. The amplitude of the carrier wave of the PIF signal is greater in the synchronizing period than in the picture period, the PLL can be expected to be in a stable locked state, and the SH circuit 58 can sample the VCO control voltage $V_{CNT}$ in the stable state. For example, a period of the horizontal synchronization signal (sync chip) can be set for the period $P_{SH}$. The $P_{SH}$ can also be set to a color burst period or other period in the horizontal synchronizing period.

An operation characteristic to the present VIF circuit shall next be described. In the above-described circuit, a voltage $V_{TH}$ of the standard-voltage source 70 is set as a threshold value for determining whether the picture signal is in a state of overmodulation. In other words, when the picture signal is less than or equal to $V_{TH}$, the picture signal is determined to be in a state of normal modulation and not overmodulation. On the other hand, when the picture signal exceeds $V_{TH}$, the picture signal is determined to be in a state of overmodulation. $V_{TH}$ need not be a value set by a regulation (e.g., a voltage that corresponds to the above-described 87.5% degree of modulation), and can essentially be set arbitrarily within a range lower than the voltage of a picture signal in which the amplitude of the PIF signal becomes very low due to an increase in the degree of modulation and the PLL assumes an unlocked state. Since the amplitude of the PIF signal is very low, when the range of the degree of modulation in which the PLL cannot detect the carrier wave from the PIF signal is assumed to be $\alpha_-$ to $\alpha_+$ ($\alpha_- < 100\%$, $100\% < \alpha_+$), $V_{TH}$ can be set to, e.g., a picture signal voltage value that corresponds to a degree of modulation $\alpha_{TH}$ that is slightly less than $\alpha_-$. This set value sustains the synchronous operation of the PLL as much as possible, whereby the phase accuracy of the reproduced carrier wave after the picture signal has exceeded $V_{TH}$ and the $V_{CNT}$ has been replaced by $V_{SH}$ can be improved.

Figure 5:
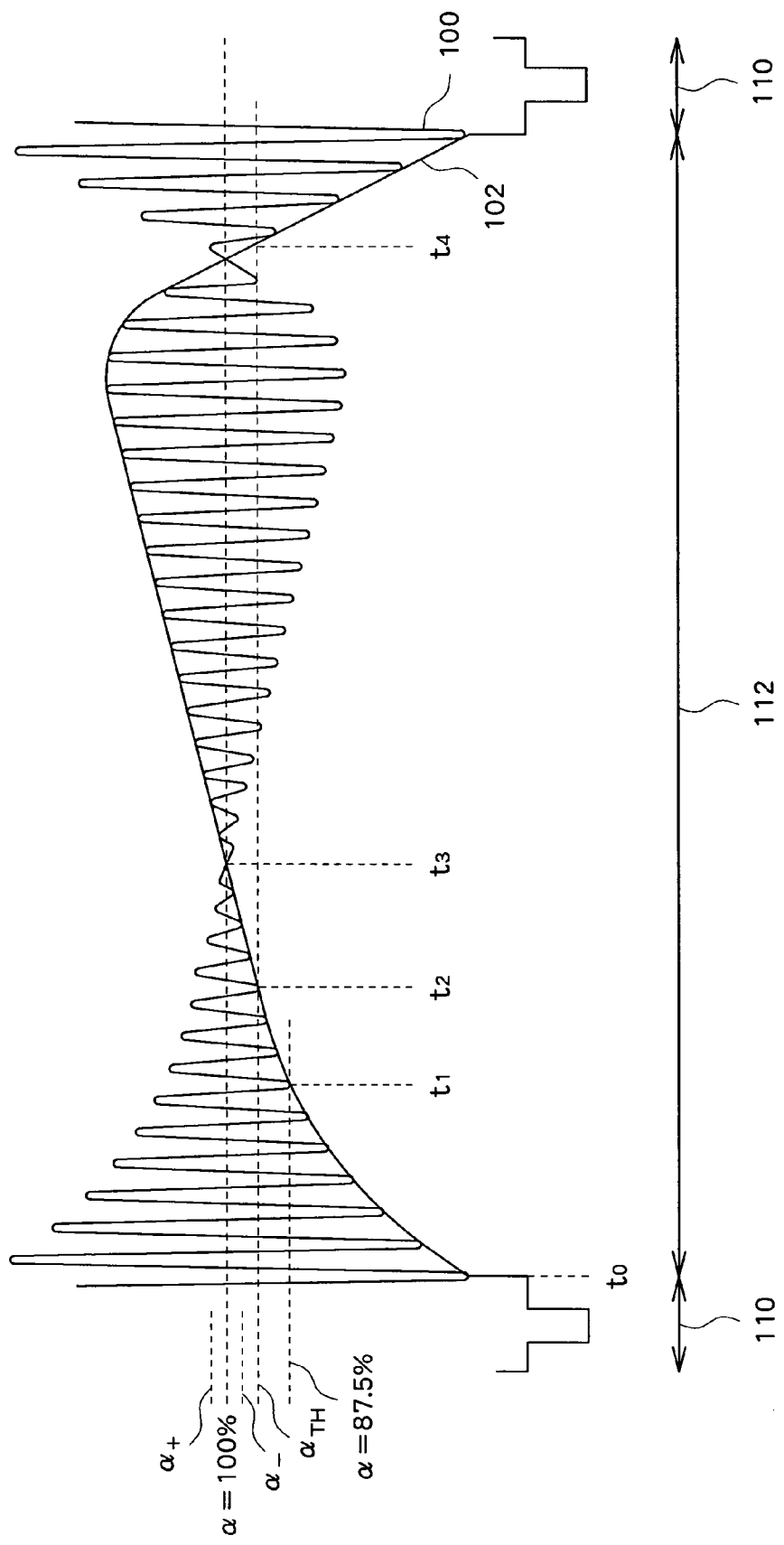
FIG. 5 is a schematic view showing examples of a PIF signal and a picture signal showing a basic operation of the VIF circuit of the embodiment of the present invention.

FIG. 5 is a schematic view showing examples of a PIF signal input to the present VIF circuit and a picture signal detected by the present VIF circuit. In FIG. 5, the horizontal axis indicates time and the vertical axis indicates amplitude. A PIF signal 100 oscillates at a short cycle in accordance with a carrier wave frequency fc, and is modulated in amplitude according to a picture signal 102. The PIF signal 100 is composed of a horizontal synchronizing period 110 that is amplitude-modulated using a predetermined format, and a picture period 112 that is amplitude-modulated using a picture signal corresponding to a brightness of a picture. The example shown in the drawing illustrates an instance in which the degree of amplitude-modulation a of the picture signal gradually increases, sequentially exceeds 87.5% and 100%, and then decreases to less than 100%.

Before a time t2 at which the picture signal is less than or equal to $V_{TH}$, i.e., at which the degree of modulation a is less than or equal to $\alpha_{TH}$, the signal path connecting the terminal 52 of the APC filter 54 to the VCO 48 passes through the switch circuit 56, and the PLL is formed in the same manner as in the conventional VIF.

α exceeds 87.5% at a time t1, and exceeds $\alpha_{TH}$ at the time t2. The picture signal exceeds $V_{TH}$ at the time t2, the comparator 68 correspondingly switches the switch circuit 56, and the switch circuit 56 outputs to the VCO 48 the voltage $V_{SH}$ output by the SH circuit 58. This state is maintained while α exceeds $\alpha_{TH}$, i.e., during a period that includes the period in which α exceeds 100%.

The voltage $V_{SH}$ is fixed during the picture period. Therefore, the operation of the PLL, in which the reproduced carrier wave reflects fluctuations in the phase of the carrier waves of the PIF signal, stops during the period $\alpha > \alpha_{TH}$, when $V_{SH}$ is input to the VCO 48. As a result, even if α exceeds 100% at a time t3, the picture signal 102 will increase without instances of folding back.

In FIG. 5, α decreases from the state of exceeding 100% and becomes less than $\alpha_{TH}$ at a time t4. Thus, when the picture signal has returned from the state of exceeding $V_{TH}$ to a state of being less than or equal to $V_{TH}$, the output of the comparator 68 changes. Accordingly, the switch circuit 56 switches the APC filter 54 to a state of being connected to the VCO 48, and the operation of the PLL resumes.

In the present VIF circuit, in a state of overmodulation in which the degree of modulation exceeds α_, the oscillating frequency of the VCO 48 is set according to the voltage $V_{SH}$. Therefore, a state of free run and fluctuations in frequency due to fluctuations in the voltage of the APC filter 54 are prevented. The voltage $V_{SH}$ is updated in a 1H cycle. Therefore, the nearest states of the PLL and VCO 48 can be reflected. In other words, even if the synchronous operation of the PLL is halted during overmodulation and the VCO 48 is switched to a state of being fixed and controlled using the $V_{SH}$, a state can be maintained in which there is a small shift from a truly synchronous state. In addition, a period of a state of overmodulation fixed and controlled using $V_{SH}$ is normally only a portion of the picture period. Furthermore, as described above, the $V_{TH}$ is set approaching α_, thereby making it possible to shorten the period during which the VCO is fixed and controlled using the $V_{SH}$. The period during which the VCO is fixed and controlled using $V_{SH}$ is a short period of time within 1H, and fluctuations from the truly synchronous state that occur during this period of time can thus be essentially kept low.

The SH circuit 58 can have another circuit configuration. In the above-described embodiment, a configuration was adopted in which an assessment of a predetermined state of overmodulation was performed on the basis of a picture signal level using the comparator 68 and the standard-voltage source 70. However, another circuit configuration and assessment method can be used.

According to the present invention described above, a control voltage was stored for a voltage-controlled oscillator in a locked state before overmodulation. In the state of overmodulation, the stored control voltage is input to the voltage-controlled oscillator, and the oscillation of the voltage-controlled oscillator is controlled. Accordingly, in a state of overmodulation, instances of the voltage-controlled oscillator entering a state of free run and of drifting in the oscillation frequency of the voltage-controlled oscillator are minimized, and a suitable picture signal can be demodulated using a reproduced carrier wave obtained thereby. The sample-hold circuit updates the hold voltage synchronously with, e.g., a horizontal blanking period (HBLK), vertical blanking period (VBLK), or another synchronizing period. The update is performed for each horizontal scanning cycle (1H) and vertical scanning cycle (1V). In addition, the amplitude of the carrier wave of the PIF signal in the synchronizing period is high, and the phase locked loop is stable and can be expected to be in a precisely locked state. Therefore, a favorable locked state can be maintained even during a period during which the voltage-controlled oscillator inputs the hold voltage.

What is claimed is:

1. A picture signal detecting apparatus comprising:
    a phase locked loop configured to generate a carrier wave reproduced on the basis of a picture modulated signal in which an original carrier wave has been amplitude-modulated in accordance with a picture signal;
    a detecting circuit configured to synchronously detect the picture signal from the picture modulated signal using the reproduced carrier wave;
    a sample-and-hold circuit configured to sample and hold a control voltage of a voltage controlled oscillator in the phase locked loop in a locked state of the phase locked loop when the picture modulated signal is in a state of normal modulation that is less than or equal to a predetermined degree of modulation threshold value, and output the control voltage as a hold voltage;
    an overmodulation detecting circuit configured to detect a state of overmodulation in which the degree of modulation threshold value has been exceeded; and
    a control voltage switching circuit configured to input the hold voltage to the voltage controlled oscillator instead of the control voltage in the state of overmodulation;
    wherein the sample-and-hold circuit includes:
        (1) a synch separator configured to generate a sampling gate pulse corresponding to a specified signal period within a horizontal scanning period from the picture signal,
        (2) a comparator configured to generate a comparator output based on a comparison of the control voltage and the hold voltage, and
        (3) a shift register configured to successively approximate the control voltage based on the comparator output and the sampling gate pulse.

2. The picture signal detecting apparatus of claim 1, wherein the sample-and-hold circuit samples the hold voltage in a synchronizing period of the picture signal.

3. The picture signal detecting apparatus of claim 1, wherein the sample-and-hold circuit samples the hold voltage synchronously with a horizontal synchronization signal of the picture signal.

4. The picture signal detecting apparatus of claim 1, wherein the control voltage switching circuit has a comparator for comparing the picture signal with a voltage that corresponds to the degree of modulation threshold value, and determining a state of overmodulation.

5. The picture signal detecting apparatus of claim 1, wherein the degree of modulation threshold value is set to a value that is less than 100% and that corresponds to a degree of modulation at an upper limit at which the original carrier wave can be detected from the picture modulated signal by the phase locked loop.

\* \* \* \* \*